United States Patent
Li et al.

(10) Patent No.: US 10,565,938 B2
(45) Date of Patent: Feb. 18, 2020

(54) BLUE LIGHT COMPENSATION FILM AND OLED DISPLAY

(71) Applicant: TCL China Star Optoelectronics Technology Co., Ltd., Shenzhen (CN)

(72) Inventors: Dongze Li, Shenzhen (CN); Lixuan Chen, Shenzhen (CN)

(73) Assignee: TCL CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 433 days.

(21) Appl. No.: 15/329,239

(22) PCT Filed: Dec. 20, 2016

(86) PCT No.: PCT/CN2016/110905
§ 371 (c)(1),
(2) Date: Jan. 25, 2017

(87) PCT Pub. No.: WO2018/068394
PCT Pub. Date: Apr. 19, 2018

(65) Prior Publication Data
US 2018/0336838 A1    Nov. 22, 2018

(30) Foreign Application Priority Data
Oct. 12, 2016   (CN) .......................... 2016 1 0890915

(51) Int. Cl.
| H01L 29/08 | (2006.01) |
| G09G 3/34 | (2006.01) |
| G02B 5/20 | (2006.01) |
| H01L 27/32 | (2006.01) |

(52) U.S. Cl.
CPC ................ *G09G 3/34* (2013.01); *G02B 5/20* (2013.01); *H01L 27/322* (2013.01)

(58) Field of Classification Search
CPC .................................... G09G 3/34; G02B 5/20
USPC ..................................................... 257/40, 98
See application file for complete search history.

(56) References Cited

U.S. PATENT DOCUMENTS

2010/0147367 A1* 6/2010 Cumpston ......... H01L 31/02008
                                                         136/255

FOREIGN PATENT DOCUMENTS

| CN | 2479599 Y | 2/2002 |
| CN | 103472513 A | 12/2013 |
| CN | 105938875 A | 9/2016 |

* cited by examiner

*Primary Examiner* — Tan N Tran
(74) *Attorney, Agent, or Firm* — Leong C. Lei

(57) ABSTRACT

The present invention provides a blue light compensation film and an OLED display. The blue light compensation film of the present invention effectively absorbs blue light with wavelength longer than blue wavelength and excite blue light by using a blue light upconversion luminescent material, and effectively improves color shift white OLED device caused by short lifespan of blue electroluminescent material to achieve blue light compensation of the white OLED device and solve the of yellowing in traditional OLED display with age. The OLED display of the present invention comprises the blue light compensation film to avoid color shift problem and provides good display quality.

9 Claims, 3 Drawing Sheets

BLUE LIGHT COMPENSATION FILM AND OLED DISPLAY

BACKGROUND OF THE INVENTION

1. Field of the Invention

The present invention relates to the field of display techniques, and in particular to a blue light compensation film and OLED display.

2. The Related Arts

Since the Kodak developed the thin film organic light emitting diode (OLED) device in 1987, the development of the OLED device has been the center of attention in industry. After 30 years of development, the OLED technology is widely applied in the field of lighting and display. The OLED display is a flat panel display device and provides the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

The driving types of OLED can be divided, according to the driving method, into the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

An OLED typically comprises a substrate, an anode provided on the substrate, a hole injection layer (HIL) provided on the anode, a hole transport layer (HTL) provided on the hole injection layer, a light-emitting layer (EML) provided on the hole transport layer, an electron transport layer (ETL) provided on the light-emitting layer, an electron injection layer (EIL) provided on the electron transport layer, and a cathode provided on the electron transport layer. The theory of light-emission of OLED display the carrier injection and recombination for the semiconductor materials and organic light-emitting materials under the driving of the electric field. Specifically, the OLED display usually adopts the ITO pixel electrode and the metal electrode as the anode and the cathode. Under the driving of a certain voltage, the electron and the hole are respectively injected from the cathode and the anode into the electron transport layer and the hole transport layer respectively; and the electrons and the holes migrate through the electron transport layer and the hole transport layer respectively to the light-emitting layer to meet in the light emitting layer to form excitons and to excite the light-emitting molecules, which in turn emit visible light by radiation relaxation.

At present, in the field of display panel, the main application mode of OLED is the whole surface evaporation with red (R), green (G) and blue (B) three-color electroluminescent materials, combined to form white OLED (WOLED) and in collaboration with color filter to achieve color display. The above technology has been used by manufacturers to achieve mass production.

The use of WOLED in collaboration with color filter to color display is still basically based on OLED device, and the white light is achieved by mixing R, G, B electroluminescent materials. At present, the main problem encountered by the above technology is the lifespan of the blue electroluminescent material, which leads to a yellowish tint in the color display after the display ages.

SUMMARY OF THE INVENTION

The object of the present invention is to provide a blue light compensation film, to effectively improve the color shift in white color OLED device caused by the short lifespan of the blue electroluminescent material, to solve the yellowing problem of traditional OLED display.

Another object of the present invention is to provide an OLED display, comprising the above blue light compensation film to avoid color shift problem and provide good display quality.

To achieve the above object, the present invention provides a blue light compensation film, which comprises, from the bottom up in a stack, an adhesive layer, a first transparent film, and a second transparent film;

the blue light compensation film satisfying at least one of the two following conditions:

Condition 1: at least one of the adhesive layer, the first transparent film, and the second transparent film being doped with a blue light upconversion luminescent material;

Condition 2: at least one of a first gap between the adhesive layer and the first transparent film and a second gap between the first transparent film and the second transparent film being provided with a blue light upconversion luminescent material;

the blue light upconversion luminescent material comprising at least one of an upconversion organic luminescent material based on a triplet-triplet annihilation and a host material doped with a rare earth ion; the blue light upconversion luminescent material being capable of absorbing light with wavelength greater than the blue light wavelength and converting to blue light.

According to a preferred embodiment of the present invention, the blue light upconversion luminescent material absorbs light with wavelength greater than 630 nm and converts to blue light of wavelength 460 nm-490 nm.

According to a preferred embodiment of the present invention, the upconversion organic luminescent material based on the triplet-triplet annihilation comprises at least one of a combination of bipyridine ruthenium and 9,10-diphenylanthracene, and a combination of tetraphenylporphyrin platinum and perylen;

the bipyridine ruthenium has a structure of

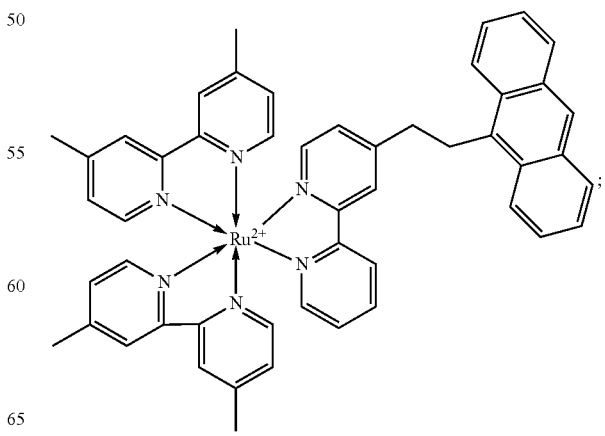

the 9,10-diphenylanthracene has a structure of

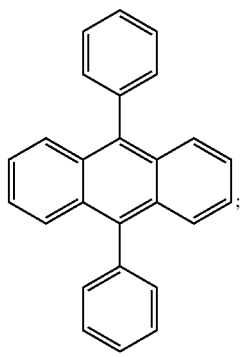 [SMILES: c1ccc(-c2c3ccccc3c(-c3ccccc3)c3ccccc23)cc1]

the tetraphenylporphyrin platinum has a structure of

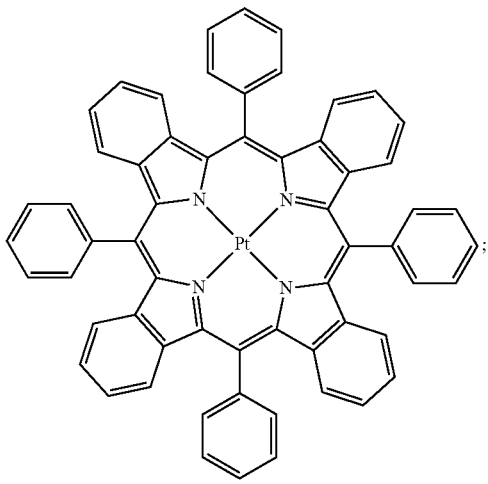

the perylen has a structure of

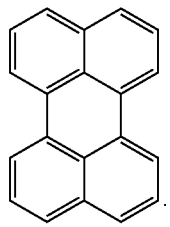 [SMILES: c1cc2cccc3c4cccc5cccc(c(c1)c23)c54]

According to a preferred embodiment of the present invention, in the host material doped with rare earth ion, the host material comprises at least one of a halogen compound, an oxide, an oxyhalide, a sulfur-containing compound, and a sulfur oxide; the rare earth ions comprises at least one of $Er^{3+}$, $Tm^{3+}$, $Dy^{3+}$, $Tb^{3+}$, $Ho^{3+}$, and $Eu^{3+}$.

According to a preferred embodiment of the present invention, the first transparent film and the second transparent film respectively comprise one or more of a polyethylene terephthalate film, a polyimide film, a cellulose triacetate film, and a cycloolefin polymer film; wherein the first transparent film and the second transparent film are a composite film of a single layer film or a multi-layer film, respectively.

According to a preferred embodiment of the present invention, the material for the adhesive layer comprises a pressure-sensitive adhesive.

According to a preferred embodiment of the present invention, in Condition 2, the blue light upconversion luminescent material is mixed with a resin and cured on at least one of the first and second gaps to form a blue light upconversion luminescent material layer.

According to a preferred embodiment of the present invention, no blue transparent luminescent material is provided between the first transparent film and the second transparent film, and the first transparent film and the second transparent film are a single unitary transparent film.

Another embodiment of the present invention provides an OLED display, which comprises: an OLED device, and a blue light compensation film provided at the light-emitting side of the OLED device; the blue light compensation film is a blue light compensation film described above and the blue light compensation film is attached to light-emitting side of the OLED device by the adhesive layer.

According to a preferred embodiment of the present invention, the light emitted by the OLED device is white light, the luminescent material of the OLED device comprises a red electroluminescent material, a green electroluminescent material and a blue electroluminescent material; the white light emitted by the OLED device is formed by mixing the red light emitted by the electroluminescent material, the green light emitted by the green electroluminescent material, and the blue light emitted by the blue electroluminescent material.

Yet another embodiment of the present invention provides a blue light compensation film, which comprises, from the bottom up in a stack, an adhesive layer, a first transparent film, and a second transparent film;

the blue light compensation film satisfying at least one of the two following conditions:

Condition 1: at least one of the adhesive layer, the first transparent film, and the second transparent film being doped with a blue light upconversion luminescent material;

Condition 2: at least one of a first gap between the adhesive layer and the first transparent film and a second gap between the first transparent film and the second transparent film being provided with a blue light upconversion luminescent material;

the blue light upconversion luminescent material comprising at least one of an upconversion organic luminescent material based on a triplet-triplet annihilation and a host material doped with a rare earth ion; the blue light upconversion luminescent material being capable of absorbing light with wavelength greater than the blue light wavelength and converting to blue light;

wherein the blue light upconversion luminescent material absorbing light with wavelength greater than 630 nm and converting to blue light of wavelength 460 nm-490 nm;

wherein the material for the adhesive layer comprising a pressure-sensitive adhesive.

Compared to the known techniques, the present invention provides the following advantages. The present invention provides a blue light compensation film which effectively absorbs blue light with wavelength longer than blue wavelength and excite blue light by blue light upconversion luminescent material, and effectively improves color shift white OLED device caused by short lifespan of blue electroluminescent material to achieve blue light compensation of the white OLED device and solve the of yellowing in traditional OLED display with age. The present invention also provides an OLED display comprising the aforementioned blue light compensating film to avoid color shift and provide good display quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
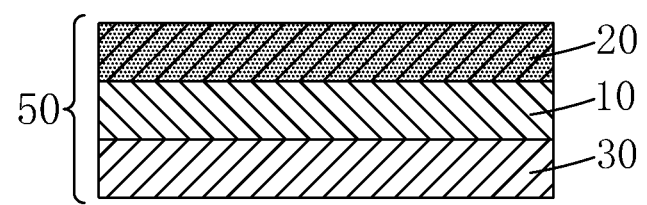
FIG. 1 is a schematic view showing a structure of the blue light compensation film provided by the first embodiment of the present invention.

To further explain the technique means and effect of the present invention, the following uses preferred embodiments and drawings for detailed description.

The present invention achieves the blue light compensation effect of a white OLED device by utilizing the property of an upconversion luminescent material, which is a material having an anti-Stokes luminescence property. The upconversion luminescent material is excited by a low-energy light to emit high-energy light, which is opposite to the Stokes luminescence mechanism. In other words, a low-frequency, short-wavelength light is absorbed to excite a high-frequency, long-wavelength light; for example, the absorption of infrared light to emit visible light, or absorb red light to emit the blue and green light. Unlike the typical luminescence process, which involving only one base state and one excited state, the upconversion process requires many intermediate states to accumulate the energy of the excited low-frequency photon.

Referring to FIGS. 1-5, the present invention provides a blue light compensation film 50, which comprises, from the bottom up in a stack, an adhesive layer 30, a first transparent film 10, and a second transparent film 20.

The blue light compensation film satisfies at least one of the two following conditions:

Condition 1: at least one of the adhesive layer 30, the first transparent film 10, and the second transparent film 20 is doped with a blue light upconversion luminescent material.

Condition 2: at least one of a first gap between the adhesive layer 30 and the first transparent film 10 and a second gap between the first transparent film 10 and the second transparent film 20 is provided with a blue light upconversion luminescent material.

The blue light upconversion luminescent material comprises at least one of an upconversion organic luminescent material based on a triplet-triplet annihilation and a host material doped with a rare earth ion; the blue light upconversion luminescent material is capable of absorbing light with wavelength greater than the blue light wavelength and converting to blue light.

Specifically, the blue light upconversion luminescent material absorbs light with wavelength greater than 630 nm and converts to blue light of wavelength 460 nm-490 nm.

Specifically, the blue light upconversion luminescent material is nano-scaled particles, having a particle diameter of 20-nm-100 nm.

Specifically, the upconversion organic luminescent material based on triplet-triplet annihilation usually comprises a donor and a receptor, a donor electron transits to the receptor energy level, and two triplets annihilate, a new energy level is generated to achieve a low energy into high-energy radiation.

Preferably, the upconversion organic luminescent material based on the triplet-triplet annihilation comprises at least one of a combination of bipyridine ruthenium and 9,10-diphenylanthracene (PDA), and a combination of tetraphenylporphyrin platinum and perylen.

The bipyridine ruthenium has a structure of

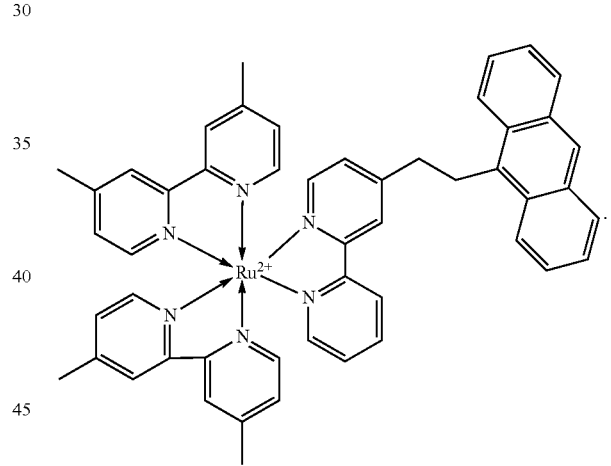

The 9,10-diphenylanthracene has a structure of

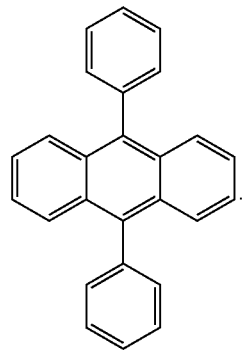 [SMILES: c1ccc(-c2c3ccccc3c(-c3ccccc3)c3ccccc23)cc1]

The tetraphenylporphyrin platinum has a structure of

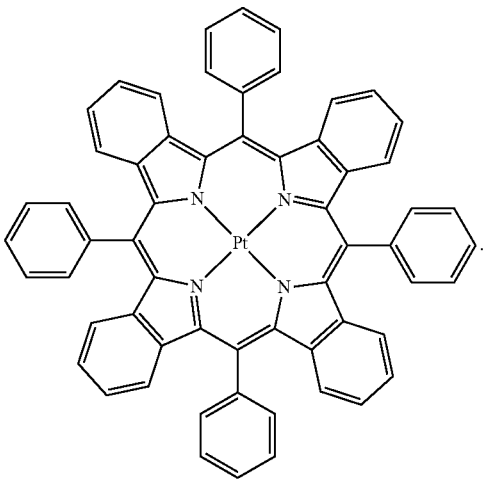

The perylen has a structure of

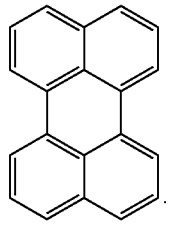 [SMILES: c1cc2cccc3c4cccc5cccc(c(c1)c23)c54]

Specifically, in the combination of the bipyridyl ruthenium and the 9,10-diphenylanthracene, the bipyridyl ruthenium is a donor and the 9,10-diphenylanthracene is a receptor.

Specifically, in the combination of the tetraphenylporphyrin platinum and perylene, the tetraphenylporphyrin platinum is a donor and the perylene is a receptor.

Specifically, in the host material doped with rare earth ion, the host material comprises at least one of a halogen compound, an oxide, an oxyhalide, a sulfur-containing compound, and a sulfur oxide; the rare earth ions comprises at least one of $Er^{3+}$, $Tm^{3+}$, $Dy^{3+}$, $Tb^{3+}$, $Ho^{3+}$, and $Eu^{3+}$.

Specifically, the first transparent film 10 and the second transparent film 20 respectively comprise one or more of a polyethylene terephthalate (PET) film, a polyimide (PI) film, a cellulose triacetate (TAC) film, and a cycloolefin polymer (COP) film; wherein the first transparent film 10 and the second transparent film 20 are a composite film of a single layer film or a multi-layer film, respectively. Specifically, the first transparent film 10 and the second transparent film 20 are formed by a hot press or a thermoplastic process.

Preferably, the material for the adhesive layer comprises a pressure-sensitive adhesive (PSA).

Figure 4:
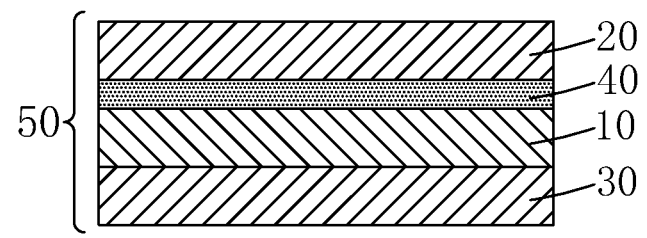
FIG. 4 is a schematic view showing a structure of the blue light compensation film provided by the fourth embodiment of the present invention.
Figure 5:
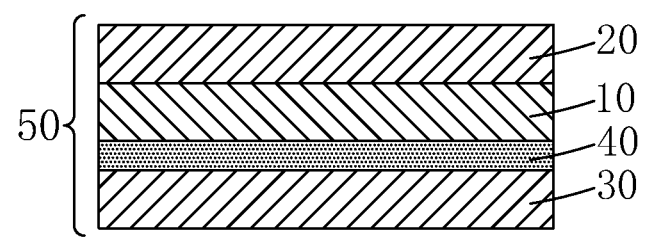
FIG. 5 is a schematic view showing a structure of the blue light compensation film provided by the fifth embodiment of the present invention.

Specifically, in Condition 2, the blue light upconversion luminescent material is mixed with a resin and cured on at least one of the first and second gaps to form a blue light upconversion luminescent material layer 40 (as shown in FIG. 4 and FIG. 5). Preferably, the resin is an epoxy resin.

As shown in FIG. 4, when the blue light upconversion luminescent material layer 40 is disposed at the second gap between the first transparent film 10 and the second transparent film 20, the blue light upconversion luminescent material layer 40 also serves to bond the first transparent film 10 and the second transparent film 20 due to the adhesive property of the resin.

Specifically, when no blue transparent luminescent material is provided between the first transparent film 10 and the second transparent film 20, and the first transparent film 10 and the second transparent film 10 are a single unitary transparent film.

Refer to FIG. 1, which is the first embodiment of the blue light compensation film 50 of the present invention. In the instant embodiment, the second transparent film 20 is doped with blue light upconversion luminescent material.

Figure 2:
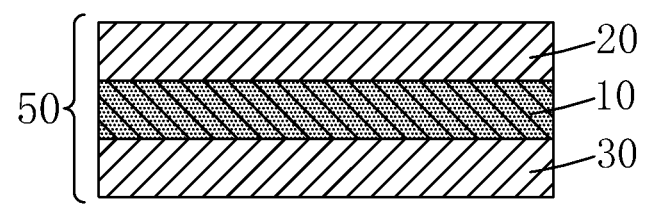
FIG. 2 is a schematic view showing a structure of the blue light compensation film provided by the second embodiment of the present invention.

Refer to FIG. 2, which is the second embodiment of the blue light compensation film 50 of the present invention. In the instant embodiment, the first transparent film 10 is doped with blue light upconversion luminescent material.

Figure 3:
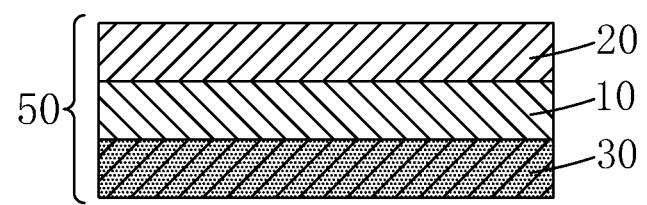
FIG. 3 is a schematic view showing a structure of the blue light compensation film provided by the third embodiment of the present invention.

Refer to FIG. 3, which is the third embodiment of the blue light compensation film 50 of the present invention. In the instant embodiment, the adhesive layer 30 is doped with blue light upconversion luminescent material.

Refer to FIG. 4, which is the fourth embodiment of the blue light compensation film 50 of the present invention. In the instant embodiment, the second gap between the first transparent film 10 and the second transparent film 20 is disposed with a blue light upconversion luminescent material layer 40.

Refer to FIG. 5, which is the fifth embodiment of the blue light compensation film 50 of the present invention. In the instant embodiment, the first gap between the adhesive layer 30 and the first transparent film 10 is disposed with a blue light upconversion luminescent material layer 40.

The blue light compensation film of the present invention effectively absorbs blue light with wavelength longer than blue wavelength and excite blue light by using a blue light upconversion luminescent material, and effectively improves color shift white OLED device caused by short lifespan of blue electroluminescent material to achieve blue light compensation of the white OLED device and solve the of yellowing in traditional OLED display with age.

Figure 6:
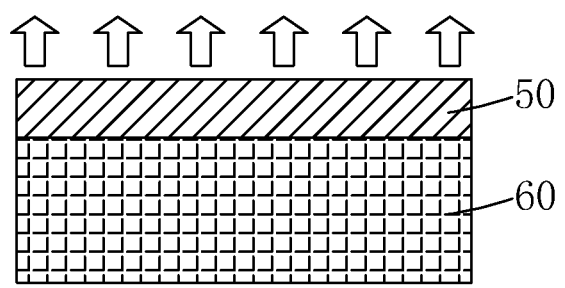
FIG. 6 is a schematic view showing a structure of the OLED display provided by an embodiment of the present invention.

Refer to FIG. 6, the present invention also provides an OLED display, which comprises: an OLED device 60, and a blue light compensation film 50 provided at the light-emitting side of the OLED device 60. The blue light compensation film is as described above and the blue light compensation film 50 is attached to light-emitting side of the OLED device 60 by the adhesive layer 30.

Specifically, the light emitted by the OLED device 60 is white light, the luminescent material of the OLED device 60 comprises a red electroluminescent material, a green electroluminescent material and a blue electroluminescent material; the white light emitted by the OLED device is formed by mixing the red light emitted by the electroluminescent material, the green light emitted by the green electroluminescent material, and the blue light emitted by the blue electroluminescent material.

The above OLED display comprises a blue light compensation film, and is able to effectively improves color shift white OLED device caused by short lifespan of blue electroluminescent material to achieve blue light compensation of the white OLED device and solve the of yellowing in traditional OLED display with age.

In summary, the present invention provides a blue light compensation film and an OLED display. The blue light compensation film of the present invention effectively absorbs blue light with wavelength longer than blue wavelength and excite blue light by using a blue light upconversion luminescent material, and effectively improves color shift white OLED device caused by short lifespan of blue electroluminescent material to achieve blue light compensation of the white OLED device and solve the of yellowing in traditional OLED display with age. The OLED display of the present invention comprises the blue light compensation film to avoid color shift problem and provides good display quality.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A blue light compensation film, which comprises, from the bottom up in a stack, an adhesive layer, a first transparent film, and a second transparent film;
   the blue light compensation film satisfying following condition:
   the second transparent film being doped with a blue light upconversion luminescent material;
   the blue light upconversion luminescent material comprising at least one of an upconversion organic luminescent material based on a triplet-triplet annihilation and a host material doped with a rare earth ion; the blue light upconversion luminescent material being capable of absorbing light with wavelength greater than the blue light wavelength and converting to blue light.

2. The blue light compensation film as claimed in claim 1, wherein the blue light upconversion luminescent material absorbs light with wavelength greater than 630 nm and converts to blue light of wavelength 460 nm-490 nm.

3. The blue light compensation film as claimed in claim 1, wherein the upconversion organic luminescent material based on the triplet-triplet annihilation comprises at least one of a combination of bipyridine ruthenium and 9,10-diphenylanthracene, and a combination of tetraphenylporphyrin platinum and perylen;
   the bipyridine ruthenium has a structure of

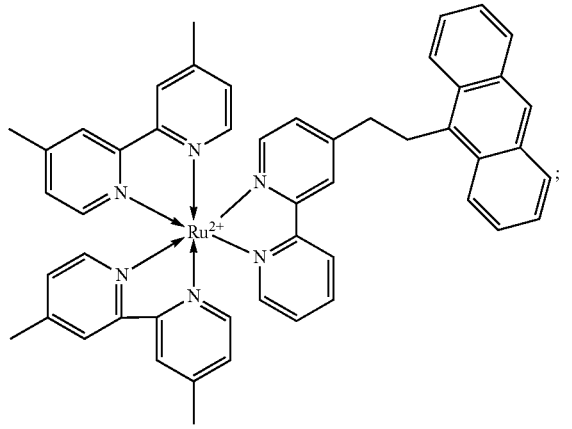

the 9,10-diphenylanthracene has a structure of

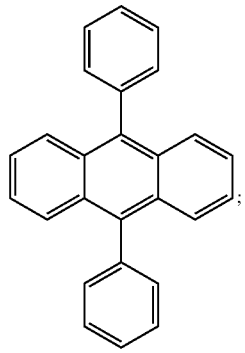 [SMILES: c1ccc(-c2c3ccccc3c(-c3ccccc3)c3ccccc23)cc1]

the tetraphenylporphyrin platinum has a structure of

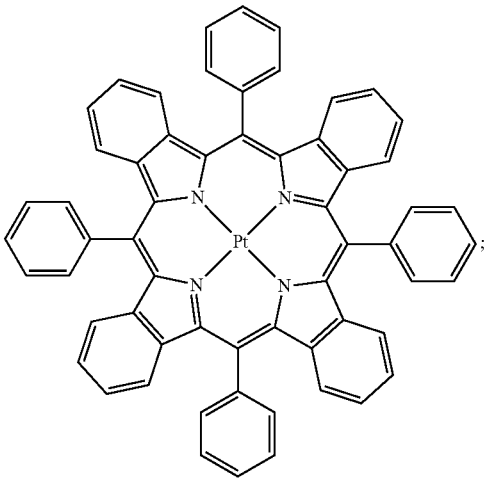

the perylen has a structure of

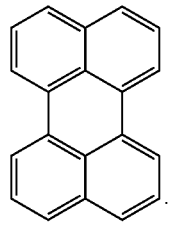 [SMILES: c1cc2cccc3c4cccc5cccc(c(c1)c23)c54]

4. The blue light compensation film as claimed in claim 1, wherein in the host material doped with rare earth ion, the host material comprises at least one of a halogen compound, an oxide, an oxyhalide, a sulfur-containing compound, and a sulfur oxide; the rare earth ions comprises at least one of Er3+, Tm3+, Dy3+, Tb3+, Ho3+, and Eu3+.

5. The blue light compensation film as claimed in claim 1, wherein the first transparent film and the second transparent film respectively comprise one or more of a polyethylene terephthalate film, a polyimide film, a cellulose triacetate film, and a cycloolefin polymer film; wherein the first transparent film and the second transparent film are a composite film of a single layer film or a multi-layer film, respectively.

6. The blue light compensation film as claimed in claim 1, wherein the material for the adhesive layer comprises a pressure-sensitive adhesive.

7. The blue light compensation film as claimed in claim 1, wherein no blue transparent luminescent material is provided between the first transparent film and the second transparent film, and the first transparent film and the second transparent film are a single unitary transparent film.

8. An organic light-emitting diode (OLED) display, which comprises: an OLED device, and a blue light compensation film provided at the light-emitting side of the OLED device; the blue light compensation film is a blue light compensation film described in claim 1 and the blue light compensation film is attached to light-emitting side of the OLED device by the adhesive layer.

9. The OLED display as claimed as in claim 8, wherein the light emitted by the OLED device is white light, the luminescent material of the OLED device comprises a red electroluminescent material, a green electroluminescent material and a blue electroluminescent material; the white light emitted by the OLED device is formed by mixing the red light emitted by the electroluminescent material, the green light emitted by the green electroluminescent material, and the blue light emitted by the blue electroluminescent material.

* * * * *